United States Patent
Glenn et al.

(10) Patent No.: US 9,454,171 B2
(45) Date of Patent: Sep. 27, 2016

(54) VALIDATION CIRCUIT FOR REFERENCE VOLTAGE SHIFTED DATA

(71) Applicant: DELPHI TECHNOLOGIES, INC., Troy, MI (US)

(72) Inventors: Jack L. Glenn, Kokomo, IN (US); Mark W. Gose, Kokomo, IN (US); Daniel C. Penrod, Russiaville, IN (US)

(73) Assignee: Delphi Technologies, Inc., Troy, MI (US)

( * ) Notice: Subject to any disclaimer, the term of this patent is extended or adjusted under 35 U.S.C. 154(b) by 11 days.

(21) Appl. No.: 14/591,623

(22) Filed: Jan. 7, 2015

(65) Prior Publication Data

US 2016/0195885 A1    Jul. 7, 2016

(51) Int. Cl.
*G11C 5/14* (2006.01)
*G05F 1/59* (2006.01)

(52) U.S. Cl.
CPC ....................................... *G05F 1/59* (2013.01)

(58) Field of Classification Search
CPC .......................................................... G05F 1/59
USPC ........................................ 365/189.09, 189.11
See application file for complete search history.

(56) References Cited

U.S. PATENT DOCUMENTS

| | | |
|---|---|---|
| 1,677,062 A | 7/1928 | Verdan et al. |
| 5,789,991 A | 8/1998 | Ishii |
| 5,900,714 A * | 5/1999 | Dubhashi ........... G01R 19/0092 318/811 |
| 6,018,467 A * | 1/2000 | Majid ............... H02M 3/33523 363/16 |
| 6,154,375 A * | 11/2000 | Majid ..................... H02M 1/36 323/901 |
| 6,414,400 B1 * | 7/2002 | Scott ....................... F02P 9/005 290/40 A |

(Continued)

FOREIGN PATENT DOCUMENTS

| | | |
|---|---|---|
| FR | 595 335 A | 9/1925 |
| WO | 2013/093412 A1 | 6/2013 |

*Primary Examiner* — Viet Q Nguyen
(74) *Attorney, Agent, or Firm* — Lawrence D. Hazelton

(57) ABSTRACT

A controller includes a high-side circuit, a low-side circuit, a level-shift circuit, and a data-validation circuit. The high-side circuit is referenced to an offset-voltage reference that is offset voltage-wise relative to a ground reference of the controller. The low-side circuit is operable to output a control signal for the high-side circuit. The control signal is referenced to the ground reference. The level-shift circuit is configured to output a shifted signal to the high-side circuit that is referenced to the offset-voltage reference and based on the control signal. The data-validation circuit is configured to receive the shifted signal, determine a first value of the shifted signal at a first instant, determine a second value of the shifted signal at a second instant different in time from the first instant, and validate the shifted signal based on a determination that the first value and the second value correspond.

10 Claims, 3 Drawing Sheets

(56) References Cited

U.S. PATENT DOCUMENTS

| | | | | |
|---|---|---|---|---|
| 8,044,699 B1* | 10/2011 | Kelly | ............. | H03K 19/017536 327/333 |
| 8,416,006 B1* | 4/2013 | Timonen | ............... | G09G 3/3677 326/81 |
| 8,970,260 B1* | 3/2015 | de Haas | ......... | H03K 19/017509 327/108 |
| 2001/0024134 A1 | 9/2001 | Dubhashi et al. | | |
| 2003/0112040 A1 | 6/2003 | Yoshimura | | |
| 2006/0006423 A1* | 1/2006 | Iwamatsu | ......... | H01L 21/67092 257/222 |
| 2006/0256589 A1* | 11/2006 | Choi | ....................... | H02M 1/38 363/56.04 |
| 2007/0210780 A1* | 9/2007 | Kataoka | ............... | H03K 17/162 323/285 |
| 2007/0227489 A1* | 10/2007 | Ando | ..................... | B60R 25/04 123/179.3 |
| 2009/0256617 A1* | 10/2009 | Ochi | ..................... | H03F 3/2173 327/333 |
| 2010/0109773 A1* | 5/2010 | Takagi | .................... | H03F 3/217 330/251 |
| 2013/0057243 A1* | 3/2013 | Yang | ......................... | G05F 5/00 323/301 |
| 2014/0095953 A1 | 4/2014 | Paul et al. | | |
| 2014/0368147 A1* | 12/2014 | Barrenscheen | ........ | H02H 3/083 318/490 |
| 2016/0065208 A1* | 3/2016 | Moriya | .............. | H03K 17/6871 318/696 |

\* cited by examiner

VALIDATION CIRCUIT FOR REFERENCE VOLTAGE SHIFTED DATA

TECHNICAL FIELD OF INVENTION

This disclosure generally relates to electronic circuits that have both a ground referenced circuit and an offset-voltage referenced circuit, and more particularly relates to a data-validation circuit that validates data transmitted between the ground and offset-voltage referenced circuits by determining if data captured at two or more different instances in time correspond to each other.

BACKGROUND OF INVENTION

Electrical circuits (e.g. controllers) that control the coupling or application of a high-side voltage and a low-side voltage to an electrical load such as an electric motor or a fuel injector are known. Such controllers commonly have a high-side circuit that controls the application of the high-side voltage to a terminal of the load, and a low-side circuit that controls the application of the low-side voltage to a terminal of the load. The low-side circuit may include signal-processing logic and/or a processor with low-voltage signals that are typically referenced to a ground-reference (e.g. ground voltage). However, the high-side circuit may be referenced to a voltage other than ground, an offset voltage such as a high-side terminal of the load for example. Such a configuration typically requires the controller to include a level-shift circuit so the ground referenced logic signals can be coupled or transitioned to the high-side circuit.

It has been observed that level-shift circuits that transmit data between the high-side circuit and the low-side circuit can be corrupted by noise present between the different voltage references of the respective circuits. The noise may be caused by, for example, capacitive displacement current in the level shifters. Such noise can cause the voltage difference between the different voltage references to vary or fluctuate, so can result in data transmission errors (e.g. false 1s and 0s) between the two circuits. Prior attempts at filter incoming data or messages incur an undesirable delay when high speed messaging is essential. However, validation of data at the destination is desired to assure that the correct digital message has been received. Another alternative is to reply with received data by feeding the received message from the destination back to the source, i.e. back to the circuit that originated the received message. However, this feedback signal is susceptible to the same noise that corrupts the message from the source, and also incurs undesirable delays.

SUMMARY OF THE INVENTION

Described herein is a controller configured to communicate digital data from a source (e.g. a low-side circuit) to a destination (e.g. a high-side circuit) which may have different supply voltages and reference voltages such that the destination reference voltage can be moving relative to the source reference voltage. The controller verifies that digital data transferred from the source is received correctly in loading registers at the destination prior to the data being copied to protected registers at the destination. The controller further ensures that corrupting noise prior to, during, or after the transmission will be detected even if the noise has the effect of blocking transmission all together. The controller further ensures that corrupting noise before or after an intended transmission does not lead to the need to resend the intended transmission.

In accordance with one embodiment, a controller is provided. The controller includes a high-side circuit, a low-side circuit, a level-shift circuit, and a data-validation circuit. The high-side circuit is referenced to an offset-voltage reference that is offset voltage-wise relative to a ground reference of the controller. The low-side circuit is operable to output a control signal for the high-side circuit. The control signal is referenced to the ground reference. The level-shift circuit is configured to output a shifted signal to the high-side circuit that is referenced to the offset-voltage reference and based on the control signal. The data-validation circuit is configured to receive the shifted signal, determine a first value of the shifted signal at a first instant, determine a second value of the shifted signal at a second instant different in time from the first instant, and validate the shifted signal based on a determination that the first value and the second value correspond.

Further features and advantages will appear more clearly on a reading of the following detailed description of the preferred embodiment, which is given by way of non-limiting example only and with reference to the accompanying drawings.

BRIEF DESCRIPTION OF DRAWINGS

The present invention will now be described, by way of example with reference to the accompanying drawings, in which.

DETAILED DESCRIPTION

Figure 1:
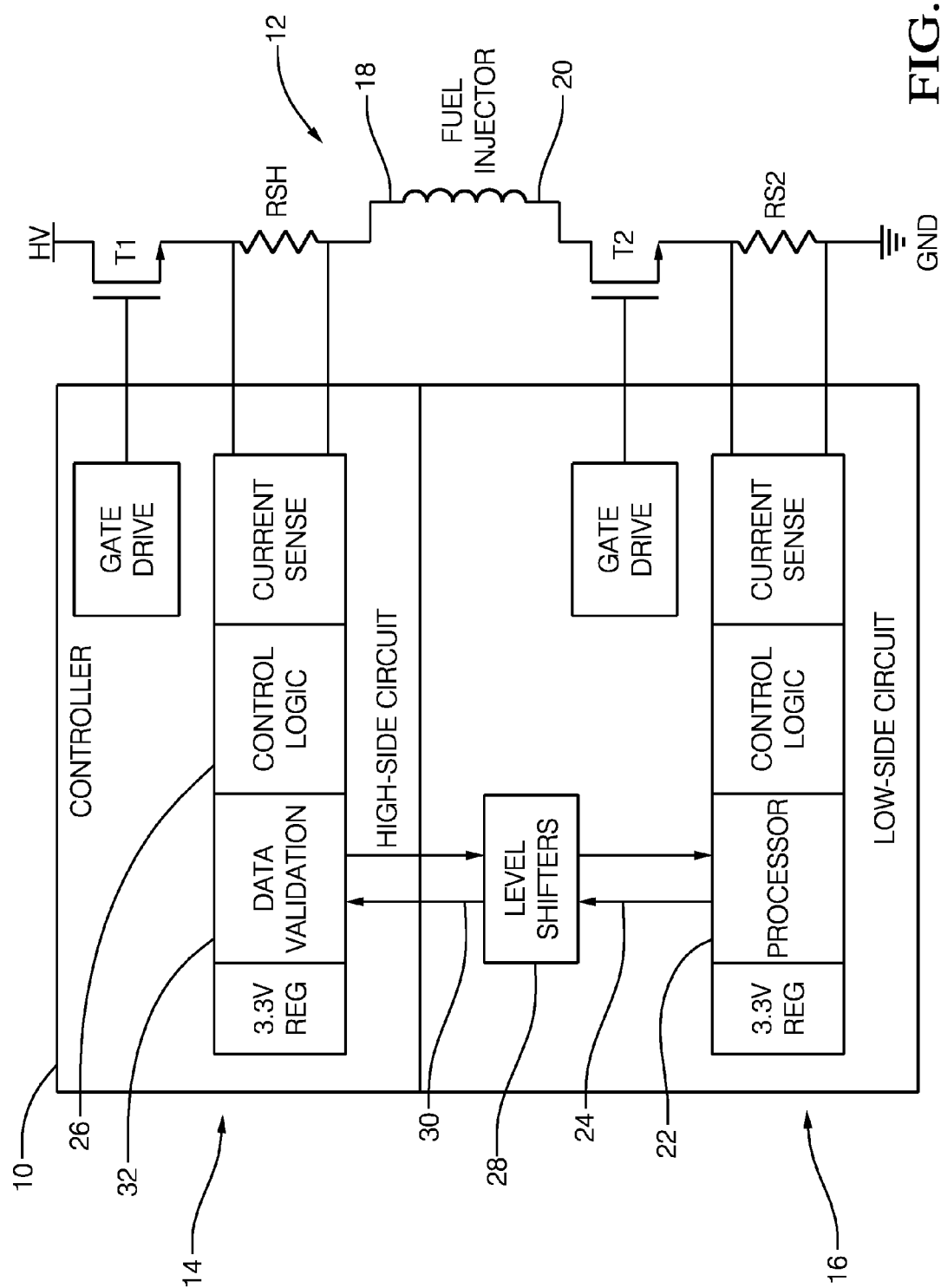
FIG. 1 is a diagram of a controller equipped with a level shift circuit and a data validation circuit in accordance with one embodiment.

FIG. 1 illustrates a non-limiting example of a controller 10 configured to control the application or coupling of voltage and/or current to a load 12, for example a fuel injector as suggested in FIG. 1, or alternatively an electric motor or other electro-mechanical device. While not specifically shown, those in the art will recognize that a diode may be connected to the fuel injector to dissipate electrical energy stored by the fuel injector when current flows through the fuel injector. This diode may be located external to the controller 10, or may be integrated into the controller 10. Current sense resistors RSH and RSL, and switches T1 and T2 are shown as being external to the controller 10, but it is recognized that these resistors and switches could be integrated into the controller 10. It is contemplated that the controller 10 described herein could be implemented on a single application specific integrated circuit (ASIC), or could be part of a larger engine control module (ECM) in a vehicle (not shown), or could be configured as a stand-alone device closely located to the fuel injector and receiving control instructions via a data link (not shown) from a remotely located ECM.

The controller 10 generally includes a high-side circuit 14 and a low-side circuit 16. The high-side circuit 14 is referenced to an offset-voltage reference that is offset voltage-wise relative to a ground voltage reference (e.g. GND) of the controller 10. The high-side circuit 14 may be operable to couple or apply a high-side voltage HV (e.g. 12 Vdc to 48 Vdc) to a high-side terminal 18 of the load 12, and the low-side circuit 16 may be operable to couple or apply a low-side voltage GND (e.g. 0 Vdc) to a low-side terminal 20 of the load 12. The low-side circuit 16 includes a processor 22 that is operable to output a control signal 24 for the high-side circuit 14. That is, the intent is to operate the high-side circuit 14 in accordance with data or information conveyed by the control signal 24, and do so in a way that avoids problems with noise causing the relative shifting or variation of the voltage difference between the offset-voltage reference of the high-side circuit 14 and the ground reference voltage of the low-side circuit 16.

The processor 22 may be a microprocessor or other control circuitry such as analog and/or digital control circuitry for processing data as should be evident to those in the art. The processor 22 may include memory, including non-volatile memory, such as electrically erasable programmable read-only memory (EEPROM) for storing one or more routines, thresholds and captured data. One or more routines may be executed by the processor 22 to perform steps for applying electrical power to the load 12.

The processor 22 and other signal level devices in the low-side circuit 16 are typically ground reference devices, so it follows that the control signal 24 is referenced to the same ground reference, GND for example. However, in order for the high-side circuit 14 to be able to use low voltage electronic devices to process relatively low voltage (e.g. 0-3.3 Vdc) signals such as those in the control logic block 26 of the high-side circuit 14, the high-side circuit 14 is referenced to a floating voltage such as the voltage at the high-side terminal 18. It will be recognized by those in the art that as the high-side circuit 14 operates, for example, the transistor T1 to alternately couple or isolate the high-side terminal 18 to the high-side voltage HV, the reference voltage for the high-side circuit 14 changes relative to the ground reference (e.g. GND) for the low-side circuit 16.

Accordingly, the controller 10 includes a level-shift circuit 28 configured to output a shifted signal 30 to the high-side circuit 14 that is referenced to the offset-voltage reference (e.g. the high-side terminal 18) and is based on the control signal 24. Those in the art will recognize that various circuit configurations are known that perform the task of the level-shift circuit 28. As will be explained in more detail below, the control signal 24 may include multiple data-bits and one or more control-bits, clock and/or address bits for example, in a serial or parallel arrangement. As noted above, it has been observed that typical configurations of the level-shift circuit 28 may be susceptible to ground shift noise, i.e. variation in the relative voltage difference between the references of the high-side circuit 14 and the low-side circuit 16.

While the operating of the transistor T1 and/or T2 are recognized causes of ground shift noise that could cause data errors, the teachings presented herein are also applicable to other devices or controllers that need to transmit or communicate data between a ground reference circuit and another circuit referenced to an offset-voltage reference. That is, the teachings presented herein are useful in circuits other than those that are used to control electromechanical devices such as fuel injectors or electric motors. Another source of noise that could cause data communication errors is electromagnetic interference (EMI) which may induce noise on the high-side voltage HV. If the high-side voltage HV varies relative to GND, then the offset-voltage reference for the high-side circuit 14 may also vary relative to GND. Accordingly, the controller 10, or more specifically the high-side circuit 14 in this non-limiting example, advantageously includes a data-validation circuit 32 configured to receive the shifted signal 30. As will be explained in more detail below, the data-validation circuit 32 is well suited to detect or determine when noise such as the ground-shift noise caused by the offset-voltage reference of the high-side circuit 14 shifting relative to GND causes data errors.

Figure 2:
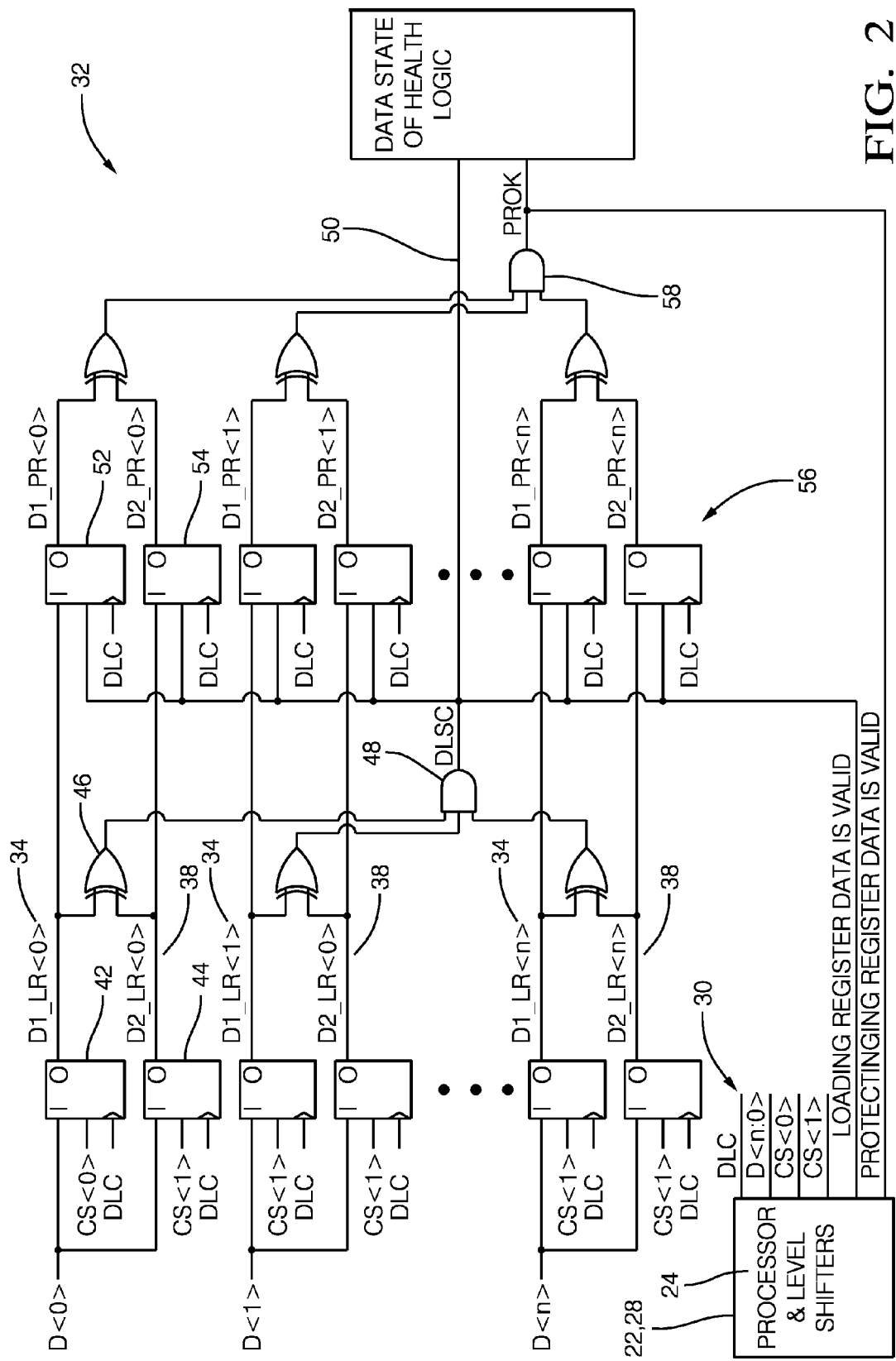
FIG. 2 is a diagram of the data validation of FIG. 1 in accordance with one embodiment.
Figure 3:
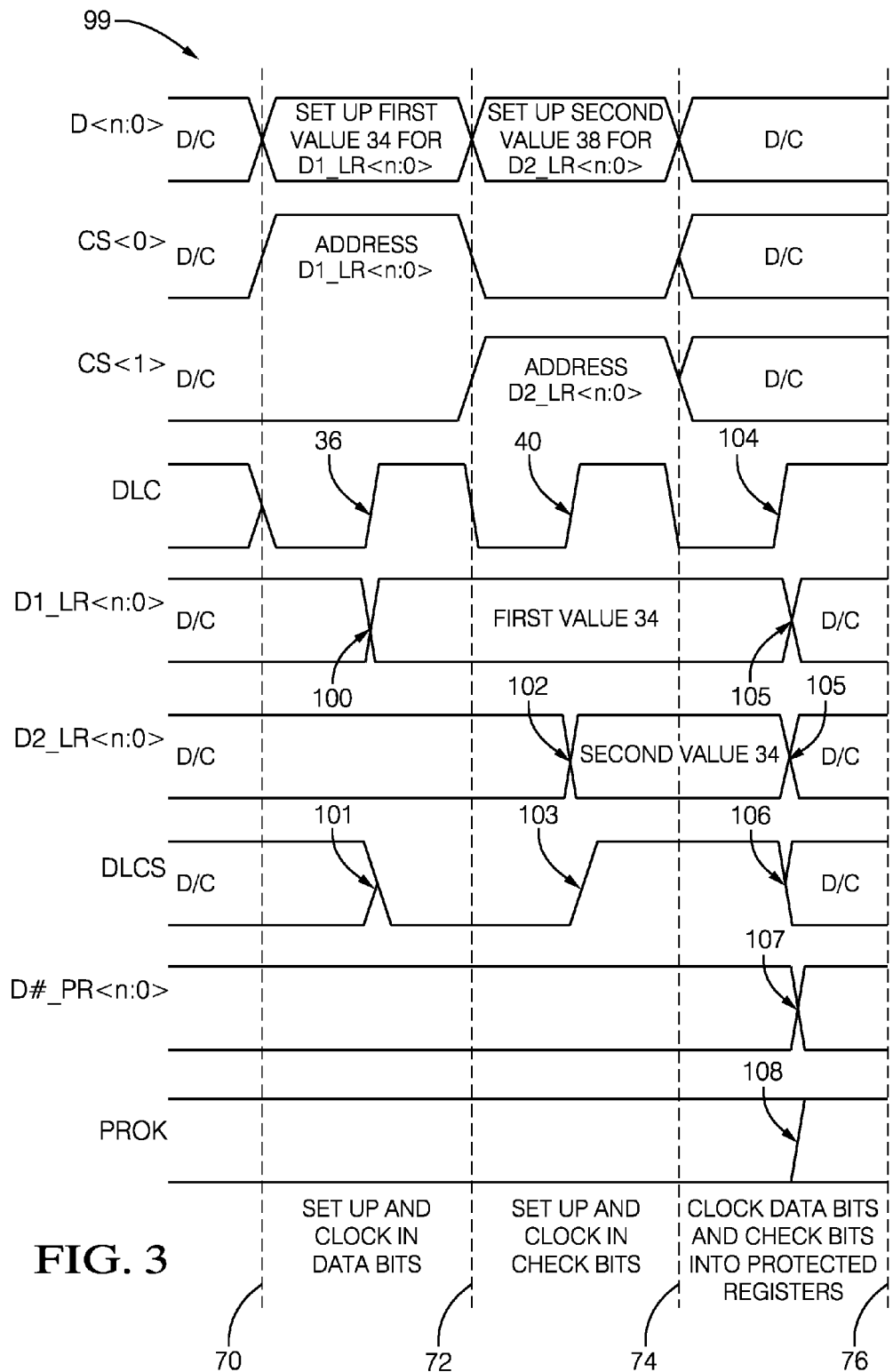
FIG. 3 is a graph of signals present in the controller of FIG. 1 in accordance with one embodiment.

FIG. 2 illustrates non-limiting details of the data-validation circuit 32. Data (D<0>, D<1>, . . . D<n>, i.e. D<n:0>) present in the control signal 24 is sent from the processor 22 via the level-shift circuit 28 to the data-validation circuit 32. In general, the data-validation circuit 32 is configured to determine a first value 34 (D1_LR<n:0>) of the shifted signal 30 at a first instant 36 (see graph 99, FIG. 3), determine a second value 38 (D2_LR<n:0>) of the shifted signal 30 at a second instant 40 different in time from the first instant 36. FIG. 3 illustrates a non-limiting example of a successful data load sequence that begins at instant 70, proceeds through instant 72 and instant 74, and ends at instant 76.

The data-validation circuit 32 is further configured to validate the shifted signal 30 based on a determination that the first value 34 and the second value 38 correspond. That is, if the values of the data captured by the data validation circuit 32 at two distinct instances in time correspond to each other, then it is presumed that the data was not corrupted by noise. As used herein, the term 'corresponds' means that the value of the data received at one instant is what is expected based on the value of the data received at the other instant. While the non-limiting example presented herein suggests that capturing data at two instances in time, it is recognized that if the noise is such that errors are frequently detected, it may be advantageous to capture data at more than two instances in time, and optionally perform a statistical analysis of the data captured at more than two instances in time to validate or determine the content of the control signal 24.

By way of example and not limitation, the controller 10 may be configured so the values of the data received at the first instant 36 and the second instant 40 are the same, i.e. are equal. In this case, the first value 34 and the second value 38 correspond if they are equal. Alternatively, the controller 10 may be configured so the control signal 24 output by the low-side circuit 16 at the second instant 40 is characterized as a ones-complement (i.e. a binary complement) of the control signal 24 output by the low-side circuit 16 at the first instant 36. In this case, the first value 34 and the second value 38 correspond to each other when the second value 38 equals a ones-complement of the first value 34. By way of further example, if the data has eight bits and the first value 34 is 10011010, then the second value 38 would correspond to the first value 34 if the second value 38 was equal to 01100101. Configuring the controller 10 so the first value 34 is the ones-complement of the second value 38 is advantageous as it provides a way to test or confirm that none of the data lines D<n:1> is stuck at '0' or '1', or that noise has caused erroneous data values to be loaded into the loading registers.

The data-validation circuit 32 includes a set of Loading Registers and a set of Protected Registers which may be provided by data latches, for example a first data latch 42 and a second data latch 44. As should be apparent, the level-shift circuit 28 has direct access to the data inputs of the Loading Register, but does not have direct access to the data inputs of the Protected Registers. A digital clock (DLC) is output by the processor 22 and received by the data-validation circuit 32 at the clock inputs of all Loading Registers (e.g. first data latch 42, second data latch 44) and Protected Registers (e.g. first data register 52, second data register 54). A first digital word (D<n:0>) and first address (CS<0>) is output by the processor 22 and received by the data-validation circuit 32 by the inputs of a first set of loading registers, e.g. the first data latch 42. A rising edge of the DLC at the first instant 36 in time latches the current value of D<n:0> into the CS<0> addressed destination loading registers at instant 100 and the resulting data on the output of the first set of loading registers is D1_LR<n:0> (i.e. the first value 34). A second digital word (D<n:0>) and second address (CS<1>) is output by the processor 22 and received by the data-validation circuit 32 by the inputs of a second set of loading registers, e.g. the second data latch 44. A rising edge of the DLC at the second instant 40 in time latches the second digital word into the CS<1> addressed destination loading registers at instant 102 and the resulting data on the output of the second set of loading registers is D2_LR<n:0> (i.e. the second value 38). It should be understood that CS<0> addresses a different set of loading registers than CS<1>.

The data validation circuit 32 also includes an exclusive-or-gate, hereafter the XOR 46, configured to indicate if the first value 34 and the second value 38 correspond. In this example the first value 34 is expected to be the ones-complement of the second value 38, so if noise does not corrupt the values, the XOR 46 will output a '1' to indicate that the first bits of the first value 34 and the second value 38 correspond. The Loading Register Validation Logic performs a bit-wise compare of D1_LR<x>with D2_LR<x>and determines if the first value 34 and the second value 38 are valid, i.e. correspond to each other.

While a single bit data validation circuit that could be used to process serial data is contemplated, the exemplary embodiment described herein has multiple bits transmitted in parallel. Accordingly, the control signal 24 includes a plurality of data-bits (D<n:0>) output in parallel. It follows that the data-validation circuit 32 includes a plurality of exclusive-or gates (XOR 46 and others) configured to compare the first value 34 and the second value 38 of each of the data-bits. In order to process all of the outputs of the plurality of exclusive-or gates, the data-validation circuit includes a first and-gate 48 configured to output a Data-Loaded-and-Stored-Correctly signal, hereafter the DLSC signal 50, when the first value 34 and the second value 38 of all of the data-bits correspond. That is, the results of each bit-wise data compare are summed by the first and-gate 48 of the Loading Register Validation Logic. The value of DLSC is observed to change in response to the values D1_LR<n:0> and D2_LR<n:0>, where the value of DLSC at instant 101 is due to the values of D1_LR<n:0> and D2_LR<n:0> at instant 100 and the value of DLSC at instant 103 is due to the values of D1_LR<n:0> and D2_LR<n:0> at instant 102.

The control signal 24 in this example includes a plurality of data-bits (D<n:0>) output in parallel, the data-validation circuit 32 includes a plurality of exclusive-or gates (XOR 46 and others) configured to compare the first value 34 and the second value 38 of each of the data-bits, and the data-validation circuit 32 includes a first and-gate 48 configured to output the DLSC signal 50 when the first value 34 and the second value 38 of all of the data-bits correspond. The result of the validation logic is observed by the processor 22 based on the DLSC signal 50 which indicates that the message sent from the processor 22 was correctly received at the driver validation circuit 32. The processor 22 may be configured to resend the data or intended message if DLSC=0 after the message is been sent. Accordingly, the level-shift circuit 28 may be further configured to shift the DLSC signal from the offset-voltage reference to the ground reference for use by the low-side circuit.

The data-validation circuit may include a protected register 56 configured to capture the outputs of the first data latch 42 and the second data latch 44 for each of the data-bits in response to the DLSC signal 50. A rising edge of DLC at instant 104 also leads to the contents of the first and second set of loading registers (the first value 34 and the second value 38) to be copied respectively into the protected register 56, e.g. the first data register 52 and the second data register 54, which are part of a set of protected registers if DLSC=1 at the time of the rising DLC edge. This is illustrated in FIG. 3 by the sequence that a rising edge of DLC at instant 104 and the presence of DLSC=1 prior to instant 106 leads to the values of D1_LR<n:0> being copied to D1_PR<n:0> and to the values of D2_LR<n:0> being copied to D2_PR<n:0> at instant 107. In this way, access to the inputs of the protected registers is restricted by logic at the destination by means of, for example, using DLSC=1 as a key to unlock access to the protected registers. The resulting data on the output of the first and second set of protected registers will be D1_PR<n:0> and D2_PR<n:0> respectively.

By way of illustration and not limitation, FIG. 3 shows that the values D1_LR<n:0> and D2_LR<n:0> are updated at instant 105 by the rising edge of DLC at instant 104 and the values D1_PR<n:0> and D2_PR<n:0> are updated at instant 107 due to the same rising edge of DLC at instant 104. Because the events of instants 105 and 107 occur due to the same DLC rising edge at instant 104, the updated values of D1_LR<n:0> and D2_LR<n:0> at instant 105 are of no consequence and therefore labeled as D/C (don't care) in FIG. 3. In this way, erroneous data loading into D1_LR<n:0> or D2_LR<n:0> at instant 105 doesn't influence the presence of valid data in these registers at instant 104 and thus doesn't impact the copying of this valid data to D1_PR<n:0> and D2_PR<n:0> at instant 107.

The data-validation circuit may also include a second and-gate 58 configured to output a Protected-Register-data-OK signal, hereafter the PROK signal 60, when the outputs of the first data latch 42 and the second data latch 44 of all of the data-bits captured by the protected register 56 correspond. Validation logic at the data outputs of the protected register 56 may include exclusive-OR (XOR) logic to perform a bit-wise compare of D1_PR<x> with D2_PR<x>, and determine if the data stored in the first and second protected registers are valid. The results of each bit-wise data compare are summed by second and-gate 58 of the protected register 56. The result of the validation logic is observed by the processor 22 as the PROK signal 60 to indicate 'Protected Register data is OK' which indicates that the contents of the protected registers at the destination are valid.

Note in FIG. 3 that the instant 108 could demark the change of PROK from 0 to 1 in response to previously invalid data in the protected registers being updated to valid data. It is also possible that PROK could remain=1 at instant 108 if it has previously been 1 prior to instant 108 or could remain 0 at instant 108, having been 0 prior to instant 108, either because newly loaded data was deemed to be invalid (DLSC=0) at instant 107 and the contents of protected registers was not updated at instant 107. It is not possible for the value of PROK to go from being a 1 prior to instant 108 to being a 0 at instant 108 in response to corrupt data being loaded into protected registers at instant 107 because the presence of DLSC precludes corrupted data from being loaded into the protected registers. Therefore, FIG. 3 does not show a downward transition of PROK from 1 to 0 as a possible mode of operation at instant 108. Accordingly, the level-shift circuit 28 may be further configured to shift the PROK signal 60 from the offset-voltage reference to the ground reference for use by the low-side circuit 16.

It is understood that noise between the low-side circuit 16 and the high-side circuit 14 can block transmission or produce erroneous data words (D<n:0>), addresses (CS<x>), and/or clocks (DLC). Noise can occur before, during, or after intended data transmission. Noise prior to an intended transmission, prior to instant 70 for example, can put erroneous data into the loading registers producing erroneous values for D1_LR<n:0> and D2_LR<n:0>. However, this erroneous data will not be copied to the protected registers if DLSC=0 and thus the values of D<n:0>, CS<0>, CS<1>, DLC, D1_LR<n:0>, D2_LR<n:0>, and DLSC are labeled as D/C (don't care) prior to the start of an intended data transmission at instant 70. DLSC=0 and PROK=1, from the previous successful load, will be observed by the source. The processor 22 will ignore the presence of invalid data in the loading registers (DLSC=0) because it can see that PROK=1 and thus concludes that protected register data is valid. The erroneous values in the loading registers will be over-written during the next intended data transmission.

Noise during the transmission will result in erroneous data in the loading registers. The source will observe DLSC=0 after the intended transmission and will have the ability to resend the intended data until it observes DLSC=1. If the correct data is finally loaded into the loading registers, then DLSC=1 and a subsequent rising edge of DLC will cause the data to be copied into the protected registers resulting in PROK=1.

It is noted that during a successful data transmission the processor 22 will have observed that the data in the protected registers was always valid (PROK=1) because only valid data can be copied into the protected registers. Noise during transmission can have the effect of blocking the clock signal itself and in this case it is possible that no part of an intended message would ever be received by the loading registers, resulting in a persistent DLSC=1. If undetected, this persistent DLSC=1 would indicate to the source that a successful transmission had occurred, when, in fact, the data in the loading the protected register 56 was simply left over from the previous successful transmission.

In one embodiment, the controller 10 protects against the problem of totally blocked transmission if the data (D<n:0>) at the first instant 36 is a ones-complement of the data at the second instant 40. If not, this will immediately result in DLSC=0 and the processor 22 will therefore observe that DLSC=0 after transmission of a new D<n:0> which is different from the previous D<n:0>. As such, a transmission that is not totally blocked will result in the source observing DLSC=0 at instant 101 in FIG. 3 followed by DLSC=1 at instant 103 of FIG. 3.

Note that PROK cannot be used to diagnose the loading of a new message into the protected registers because PROK=1 at all times during the loading of a new message. The aspect that PROK=1 at all times during the loading of a new message is also guaranteed by the invention so that PROK can be used to condition the destination circuitry, for example, the destination circuitry could be disabled if PROK=0 or enabled if PROK=1.

Note that the behavior of (i) DLSC=1 after a successful message, followed by (ii) DLSC=0 after sending a new and different D<n:0> (FIG. 3 instant 101), followed by (iii) DLSC=1 after sending a new and different ~D<n:0> (FIG. 3 instant 103) combined with (iv) a persistent PROK=1 are all important features of the invention to ensure that the source can verify that a new message was received and stored correctly while the destination utilizes PROK=1 to condition functionality. This functionality assures that corrupting noise cannot interrupt the continuous function of the destination nor can it fool the source into believing that new data was loaded into protected registers.

Noise sent after a successful data transmission, such as erroneous data in D<n:0>, CS<0>, or CS<1> after instant 74, will result in DLSC=0 after the rising edge of DLC at instant 104 while PROK=1 and will be treated in the same manner as noise sent prior to intended transmission. The source will have previously observed DLSC=1 after the last successful transmission at instant 103 and will presently observe PROK=1 and will therefore not require that the message be resent. It is also possible to lose valid data in the loading registers, the protected registers, or both due to either loss of the digital supply or due to one or more flipped bits. In either case, the source will observe PROK=0 and will resend the messages as needed until it observes that PROK=1. PROK and DLSC can also be used as a 2 bit binary word [PROK:DLSC]=00, 01, 10, 11 to condition the functionality of the destination in 4 different modes. For example, the destination can use the PROK bit to enable the on-state mode if PROK=1 or the off-state mode if PROK=0 and the destination can use the DLSC bit to enable operation that requires the latest valid message if DLSC=1 or operation that can tolerate a previous valid message if DLSC=0.

Accordingly, a controller 10 with both a high-side circuit 14 and a low-side circuit 16 is provided. The controller 10 includes a data-validation circuit 32 configured to detect or determine that the content of the control signal 24 output from the low-side circuit 16 was received without error by the high-side circuit 14. The data-validation circuit is also configured to indicate to the low-side circuit 16 (e.g. the processor 22) that a data transmission error was detected so if necessary the low-side circuit 16 can resend the message. The destination (e.g. the high-side circuit 14) can be configured to operate in a known safe operational state prior to receiving any valid message from the source (e.g. the low-side circuit 16). Messages can be sent from the source to the destination in an inherently fast and noise-immune manner. Feedback can be sent from the destination back to the source in an inherently fast and noise-immune manner. The destination can be configured to only update its operation state when it receives a valid message from the source. The destination can be configured to continue to operate with the previously-received valid message until a new valid message is received from the source. The destination can be configured to return to a known safe operational state if a valid message from the source is lost.

While this invention has been described in terms of the preferred embodiments thereof, it is not intended to be so limited, but rather only to the extent set forth in the claims that follow.

We claim:

1. A controller comprising:
   a high-side circuit referenced to an offset-voltage reference that is offset voltage-wise relative to a ground reference of the controller;
   a low-side circuit operable to output a control signal for the high-side circuit, wherein the control signal is referenced to the ground reference;
   a level-shift circuit configured to output a shifted signal to the high-side circuit that is referenced to the offset-voltage reference and based on the control signal;

a data-validation circuit configured to receive the shifted signal, determine a first value of the shifted signal at a first instant, determine a second value of the shifted signal at a second instant different in time from the first instant, and validate the shifted signal based on a determination that the first value and the second value correspond.

2. The controller in accordance with claim 1, wherein the high-side circuit is operable to apply a high-side voltage to a high-side terminal of a load, wherein the high-side circuit is referenced to the high-side terminal.

3. The controller in accordance with claim 1, wherein the low-side circuit is also operable to apply a low-side voltage to a low-side terminal of the load.

4. The controller in accordance with claim 1, wherein the control signal output by the low-side circuit at the second instant is characterized as an ones-complement of the control signal output by the low-side circuit at the first instant, whereby the first value and the second value correspond when the second value equals an ones-complement of the first value.

5. The controller in accordance with claim 1, wherein the data-validation circuit includes a first data-latch configured to capture the first value at the first instant, a second data-latch configured to capture the second value at the second instant, and an exclusive-or-gate configured to indicate if the first value and the second value correspond.

6. The controller in accordance with claim 5, wherein the control signal includes a plurality of data-bits output in parallel, the data-validation circuit includes a plurality of exclusive-or gates configured to compare the first value and the second value of each of the data-bits, and the data-validation circuit includes a first and-gate configured to output a Data-Loaded-and-Stored-Correctly (DLSC) signal when the first value and the second value of all of the data-bits correspond.

7. The controller in accordance with claim 6, wherein the level-shift circuit is further configured to shift the DLSC from the offset-voltage reference to the ground reference for use by the low-side circuit.

8. The controller in accordance with claim 6, wherein the data-validation circuit includes a protected register configured to capture the outputs of the first data latch and the second data latch for each of the data-bits in response to the DLSC signal.

9. The controller in accordance with claim 8, wherein the data-validation circuit includes a second and-gate configured to output a Protected-Register-data-OK (PROK) signal when the outputs of the first data latch and the second data latch of all of the data-bits captured by the protected register correspond.

10. The controller in accordance with claim 9, wherein the level-shift circuit is further configured to shift the PROK from the offset-voltage reference to the ground reference for use by the low-side circuit.

\* \* \* \* \*